United States Patent [19]

Hardy et al.

[11] Patent Number: 5,512,826
[45] Date of Patent: Apr. 30, 1996

[54] SCREEN-BASED INTERACTIVE IMAGE-PLANE PRESCRIPTION FOR MRI

[75] Inventors: Christopher J. Hardy, Niskayuna; Robert D. Darrow, Scotia, both of N.Y.

[73] Assignee: General Electric Company, Schenectady, N.Y.

[21] Appl. No.: 458,601

[22] Filed: Jun. 2, 1995

[51] Int. Cl.⁶ .................................................. G01R 33/48
[52] U.S. Cl. ...................... 324/309; 324/307; 128/653.2
[58] Field of Search ............................. 128/653.1, 653.2, 128/653.3; 324/300, 307, 309, 310, 311, 312, 313, 314, 318, 322

[56] References Cited

U.S. PATENT DOCUMENTS

| | | | |
|---|---|---|---|
| 5,038,783 | 8/1991 | Dumoulin | 128/653.3 |
| 5,365,927 | 11/1994 | Roemer et al. | 128/653.2 |
| 5,431,161 | 7/1995 | Ryals et al. | 128/653.1 |

OTHER PUBLICATIONS

U.S. patent application (concurrently filed case) "Scan Control Platform–Based Interactive Imaging Plane Prescription for MRI" by C. J. Hardy, R. D. Darrow (Atty. Docket No. RD–24232).

U.S. patent application "Oblique MR Image Controlled from a 3D Workstation Model" by H. E. Cline et al., Ser. No. 08/203,079, filed Feb. 28, 1994.

*Primary Examiner*—Michael Tokar
*Attorney, Agent, or Firm*—Lawrence P. Zale; Marvin Snyder

[57] ABSTRACT

An MR image of a subject is displayed on a display device. Scan-control icons are displayed over this image. An operator interacts with an interface device to select imaging plane parameters during imaging. This is performed by selecting one of the icons with a pointing device, and dragging. Interface device then provides a display which indicates the motion of the imaging plane as well as the extent of the motion. Once selected, the location and orientation information transformed to global coordinates and is provided to a pulse sequencer of a magnetic resonance (MR) imaging system. The pulse sequencer controls an RF transmitter and gradient amplifiers to cause an MR image of the subject at an imaging plane to be acquired. This allows fast, accurate imaging plane selection, which may be selected by an operator who is searching for structures within the subject, or who is simultaneously performing a medical procedure on the subject.

6 Claims, 5 Drawing Sheets

SCREEN-BASED INTERACTIVE IMAGE-PLANE PRESCRIPTION FOR MRI

CROSS REFERENCE TO RELATED APPLICATIONS

This application is related to U.S. Patent Applications "Scan Control Platform-Based Interactive Image Plane Prescription For MRI" by C. Hardy, R. Darrow (Atty. Docket No. RD-24,232) filed concurrently with this application; "Oblique MR Image Controlled from a 3D Workstation Model" by Cline et al. Ser. No. 08/203,079 filed Feb. 28, 1994; both assigned to the present assignee, and both hereby incorporated by reference.

BACKGROUND OF THE INVENTION

1. Field of the Invention

The present application relates to magnetic resonance (MR) imaging system, and more specifically to MR imaging system which allows interactive selection of imaging planes during imaging.

2. Description of Related Art

In conventional magnetic resonance (MR) imaging systems, the three dimensional location of a desired region of the patient to be imaged must be provided to the MR imaging system before obtaining the image. In addition to the location, the three dimensional orientation must also be provided. Together these define an 'imaging plane'. These locations and orientations typically are either calculated manually, or prescribed graphically, by drawing a line on a previously acquired image. Even though the computations may not be difficult, it makes it cumbersome to produce several images at different orientations. If images are being rapidly acquired in a continuous imaging mode, it is desirable that the operator keep his eyes on the new images as they are displayed, and these imaging-plane prescription techniques do not allow this. Also, the graphic prescription technique described above will only define imaging planes orthogonal to the previously acquired image.

While acquiring images of the heart it is often desirable to adjust the imaging plane interactively while searching for anatomy such as the coronary arteries. Also, with new open magnet MR Imaging systems, as described in U.S. Pat. No. 5,365,927 issued Nov. 22, 1994 "Magnetic Resonance Imaging System With Pointing Device" Roemer et al., assigned to the present Assignee, and hereby incorporated by reference; it is possible to perform medical procedures on a subject and simultaneously acquire a series of continuous MR images. When a medical procedure, such as surgery, is being performed, it is very desirable to minimize the time required to calculate location and orientation of 'imaging planes' to acquire images.

Currently there is a need for an MR imaging system which provides MR images along selected orientations through selected internal structures in the heart of a patient, in which an operator may easily indicate location and orientation of an imaging plane, and acquire an image of the subject from that plane.

SUMMARY OF THE INVENTION

A magnetic resonance (MR) imaging system provides interactive images of a patient undergoing a medical procedure.

An interface device displays a current MR image and scan-control icons over most MR images. Selection and movement of these icons controls offsets of location and orientations of the imaging plane. The operator interactively manipulates the imaging plane during imaging by selecting one of the icons either by physical buttons or screen buttons. Selection may be made with a mouse, or touch sensitive screen. The icons are then dragged to indicate which motion of the proposed imaging plane is desired, as well as the extent of the motion. A feedback display device provides a proposed imaging plane location and orientation superimposed on the image and icons, to the operator. The change in imaging plane parameters relative to the current image are stored. A global transformation unit transforms the imaging plane coordinates to global coordinates, fixed with respect to the imaging device. These global changes defining the new location and orientation of the imaging plane, are passed to a pulse sequence calculation device which calculates geometric transformation parameters required to modify a predetermined MR pulse sequence to acquire an image of said subject through the imaging plane which corresponds to the oblique prescribed plane. The modified MR pulse sequence is implemented in the MR imaging device to result in an MR image of said subject at the desired imaging plane. This image is then displayed on the display device.

OBJECTS OF THE INVENTION

It is an object of the invention to provide a magnetic resonance (MR) imaging system which produces images from an imaging plane of the subject interactively selected by an operator of the system, during continuous image acquisition.

Another object of the present invention is to provide interactive MR images to a physician to aid the physician selecting images at oblique orientations to aid in performing medical procedures.

Another object of the present invention is to allow a physician to interactively select a location and orientation of imaging planes for MR images, without removing his eyes from the images.

Another object of the present invention is to provide interactive MR images to a physician to aid the physician in locating and viewing selected structures within the heart.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
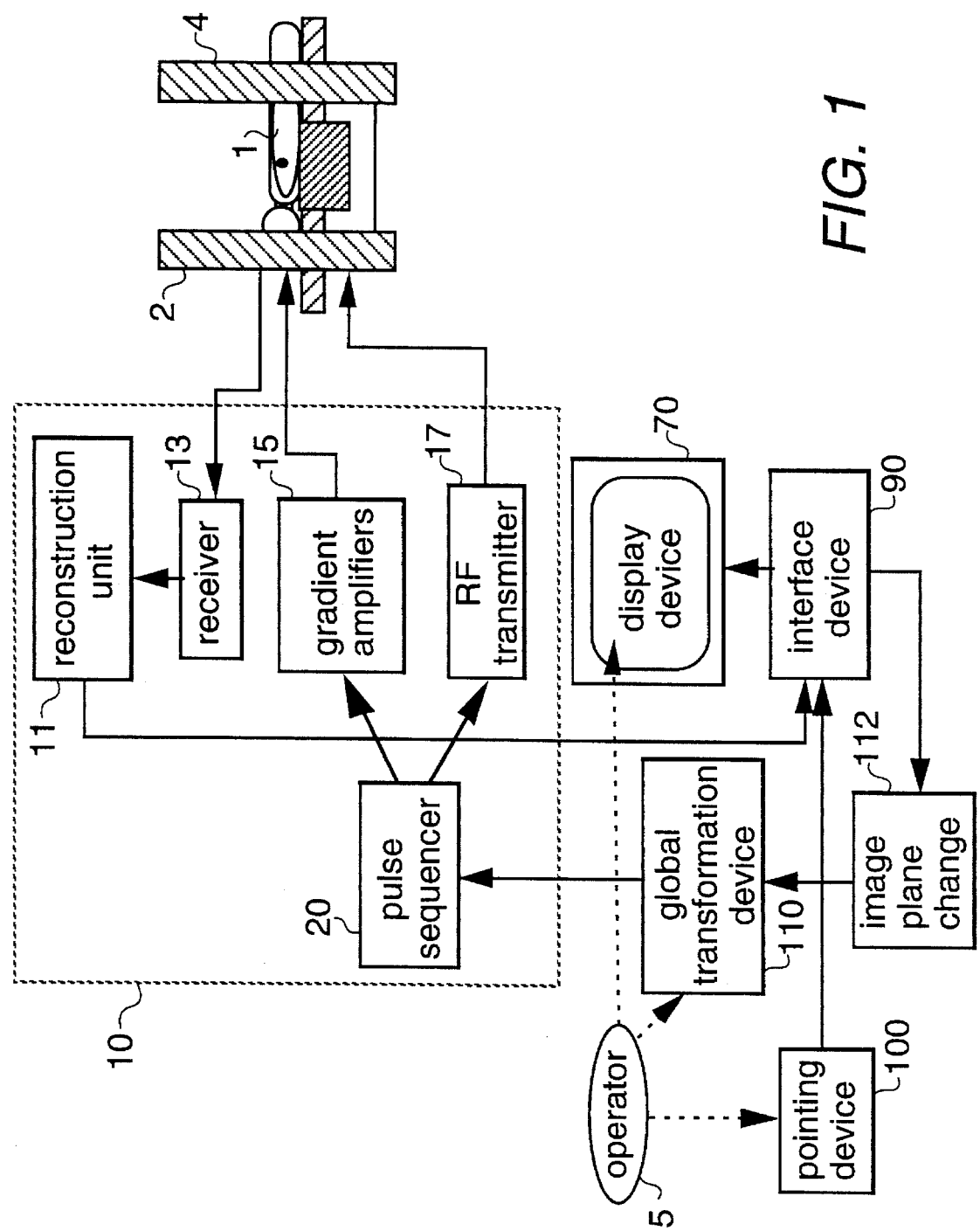
FIG. 1 is a block diagram of an embodiment of a magnetic resonance (MR) imaging system according to the present invention.

A block diagram of the magnetic resonance (MR) imaging system of the present invention is shown in FIG. 1. A subject 1 is positioned within an open main magnet, shown here having two superconducting rings 2, 4 which provides a static, spatially homogeneous magnetic field over an imaging volume between the rings. Gradient amplifiers 15 of a magnetic resonance imaging device electronics 10 provides power to a plurality of gradient coil sets located within rings 2, 4, each producing a magnetic field gradient in a specified direction. An RF transmitter 17, supplies the necessary power to RF coils to nutate nuclear spins within a patient in the imaging volume. The gradient coil sets within rings 2, 4 produce magnetic field gradients over the imaging volume without restricting access to the imaging volume, or the patient within the imaging volume.

An operator 5 interacts with interface device 90, through a pointing device 100, to select an image to be displayed on display device 70. For an initial image, operator 5 may provide manual input or other conventional techniques to determine the plane of an image to be acquired.

The plane of subject 1 in which the image is acquired is known as the "imaging plane". Pointing device 100, may be a computer mouse, a touch sensitive computer screen, virtual screen buttons, actual physical buttons, or a combination of the above. Display device 70, pointing device 100 and an interface device 90 operate to select a location and orientation of an imaging plane by performing operations on a newly acquired image displayed on display device 70. Interface device 90 receives an image from MR imaging device 10 and displays the image on display device 70. It also interacts with pointing device 100 to place a cursor on display device 70 at a location corresponding to a (u, v) location of pointing device 100. Interface device 90 also allows operator 5 to select new locations and orientations of the imaging plane, as will be described in more detail below.

Interface device 90 calculates changes to imaging plane parameters and stores these in an imaging plane change storage device 112. These updated imaging plane parameters are either provided directly to a global transformation device 110 or interface device 90 provides the parameter changes to device 110. Global transformation device 110 converts imaging plane parameters defined in an imaging plane coordinate system to the global coordinate system by 3 axis rotations ($\theta, \phi, \kappa$) between the coordinate systems and an origin translation r, between the two origins.

Pulse sequencer 20 mixes x, y, and z components of a gradient pulse sequence which would cause MR excitation of an imaging plane with no translation or rotation in the global coordinate systems, to create a pulse sequence which would cause MR excitation of an imaging plane as defined in the global coordinate system provided to it.

Pulse sequencer 20 controls the timing and activation of gradient amplifiers 15 and RF transmitter 17 to produce magnetic field gradients and RF radiation which cause an MR response signal to be emitted by tissue of subject 1 in the imaging plane.

A receiver 13 receives the emitted MR response signal from the imaging plane of patient 1, and provides this signal to a reconstruction unit 11. Reconstruction unit 11 produces data for an MR image of patient 1 at the selected imaging plane. The image data is provided to interface device 90 and displayed on display device 70.

Figure 2:
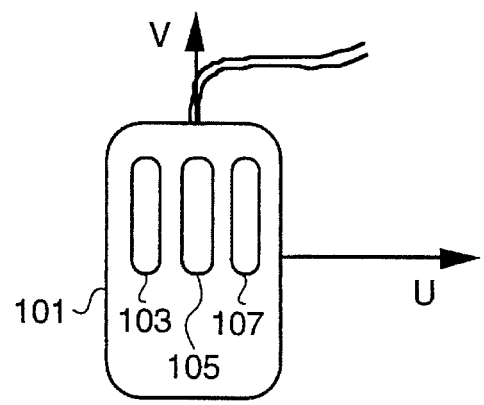
FIG. 2 is an embodiment of the pointing device of FIG. 1 compatible with the present invention.

An example of pointing device 100 is a computer mouse 101, shown in FIG. 2. This has 3 buttons on it, a left button 103, a middle button 105, and a right button 107.

Figure 3:
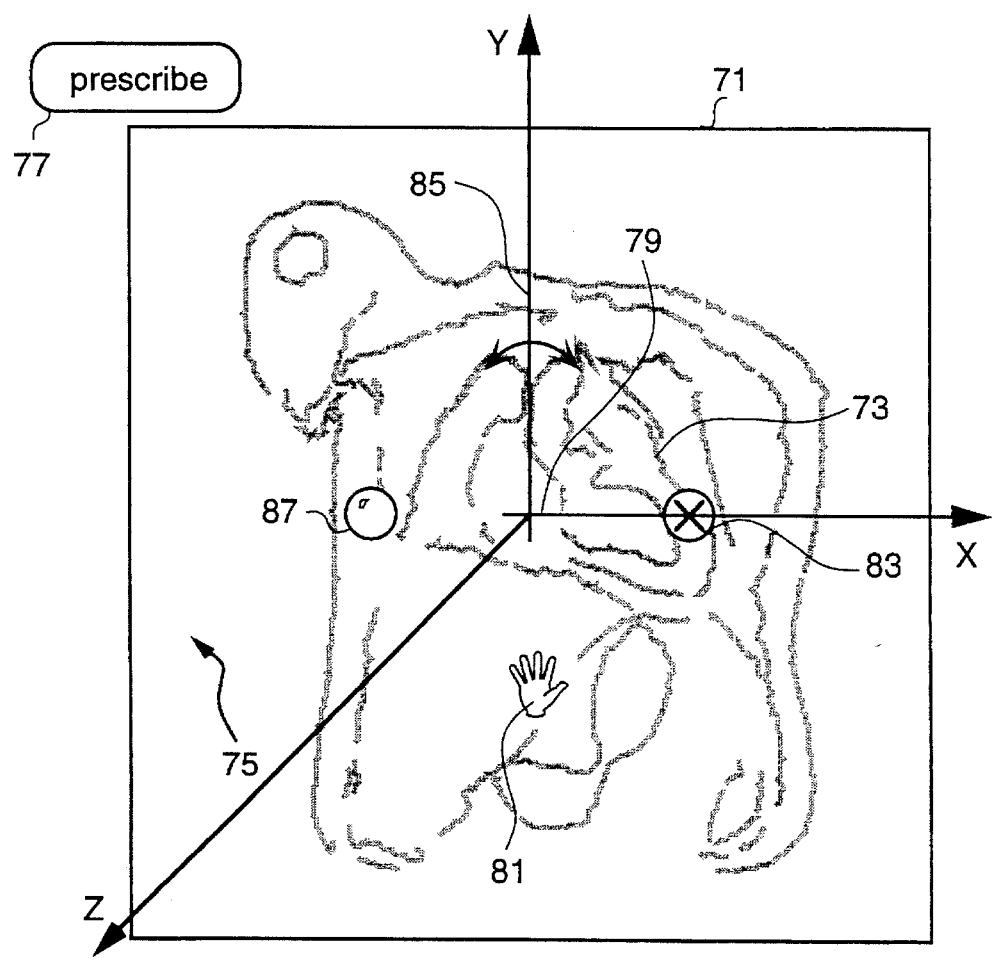
FIG. 3 is a diagram of an MR image of a subject's heart, with imaging-plane prescription icons superimposed on the image.

FIG. 3 shows an image 71 of subject 1, which is displayed on display device 70, showing a heart 73 of subject 1 in the center of the image. Operator 5 controls the location of a cursor 75 on display device 70 by moving the mouse 101 on a pad in a (u, v) direction. Using mouse 101 to prescribe button 77, located next to image 71 on display device 70, causes icons to be displayed over image 71. A plus icon 79 indicates the center of the imaging plane and the center of rotation. The other icons may be: a hand icon 81, a circle-x icon 83, a curved arrow icon 85, and a ball icon 87 indicating an (x,y) translation tool, a z translation tool, a rotation about the Z axis tool, and a rotation about the ($\theta, \phi$) axes tool. These icons remain visible during continuous imaging, but can be toggled off if needed by again selecting a prescribe button 77. The function of each icon is described below.

1) Plus icon 79 in FIG. 3 marks the center of the imaging plane. It also makes a center point about which all rotations are performed.

The following icons may be selected by depressing the mouse button when the cursor is positioned over the icon. In the case of a touch sensitive screen, selection is made by touching the icon on the screen.

In still another embodiment, depressing center or right mouse buttons may toggle through cursor types. Selection of an icon causes interface device 90 to begin operating in a mode associated with the selected icon.

Figures 5, 6:
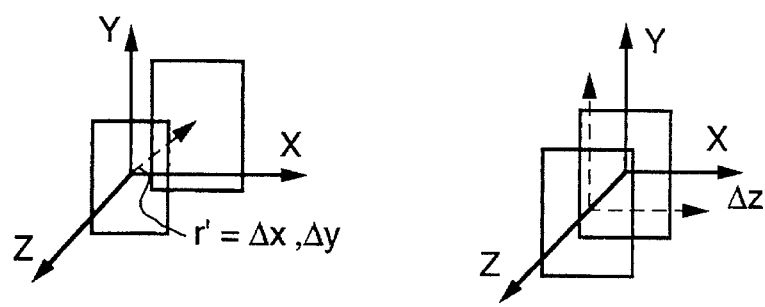
FIGS. 5, 6 illustrate the translation of the center point in the (x,y), and z directions of the imaging plane, respectively.

Translations:

1) Selecting hand icon 81 causes interface device 90 to enter an (x, y) translation mode. Dragging icon 81 causes sliding of the imaging plane. That is, it offsets the center of the next acquired image sideways and/or up and down within the same plane of the previous acquired image, as shown in FIG. 5 This operation provides 2 degrees of freedom (x,y). This is done by positioning cursor 75 over hand icon 81, depressing mouse button 103 and "dragging" to a new location moving mouse with button depressed and releasing button at new location. The imaging plane center is offset by the offset defined by the (x,y) coordinate at the beginning of the "drag" to the (x, y) coordinate at the end of the drag. The icon moves until mouse button 103 is released. The location of plus icon 79 when hand icon 81 is released becomes the new center of the imaging plane. After release of mouse button 103, the set of icons snaps back to the center of the screen and an image is acquired, displayed with the new imaging plane coordinates and displayed with plus icon 79 located in the center of the newly acquired images.

2) Circle-x icon 83 may be thought of as an arrow viewed end-on. Selecting circle icon 83 allows operator 5 to push the imaging-plane deeper or shallower in the Z direction, providing 1 degree of freedom as shown in FIG. 6. This causes interface device to be in Z depth mode. To do this, operator 5 selects the circle-x icon 83 and drags it vertically — up (moves mouse in increasing Y direction) for deeper imaging plane and, decreasing Y direction for shallower imaging plane. In this case, a outline of the proposed imaging plane may be shown in perspective (a is second circle-x) originating from the first circled-x icon 83 follows cursor 75 up or down to indicate the size and direction of the offset. The imaging plane outline can be made progressively smaller as it is dragged upward in a greater Y direction, and larger as it is dragged down, a lower Y direction to appear to be receding or advancing, respectively, to a cue the operator as to the direction of offsetting of the imaging plane. When mouse button 103 is released the imaging plane outline disappears.

Figure 7:
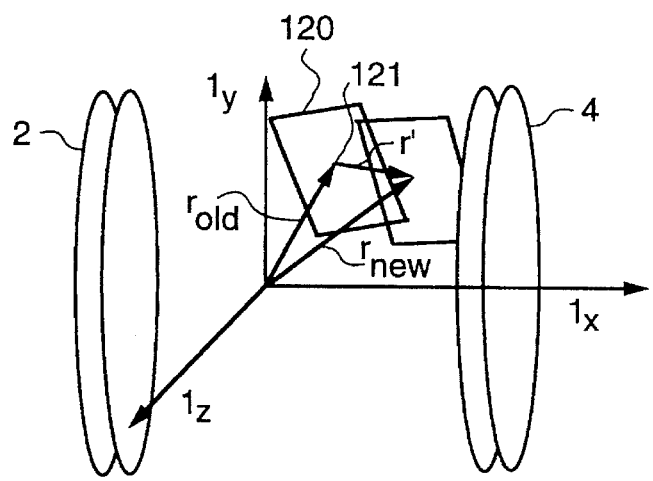
FIG. 7 illustrates the relationship between local coordinates and imager coordinates fixed with respect to the imaging device.

In FIG. 7 a vector r shows a displacement from the global coordinate origin to the center of an initial imaging plane. Translation of the proposed imaging plane with hand icon 81 and circle x icon 83, defines a displacement change r'

Figures 8, 9:
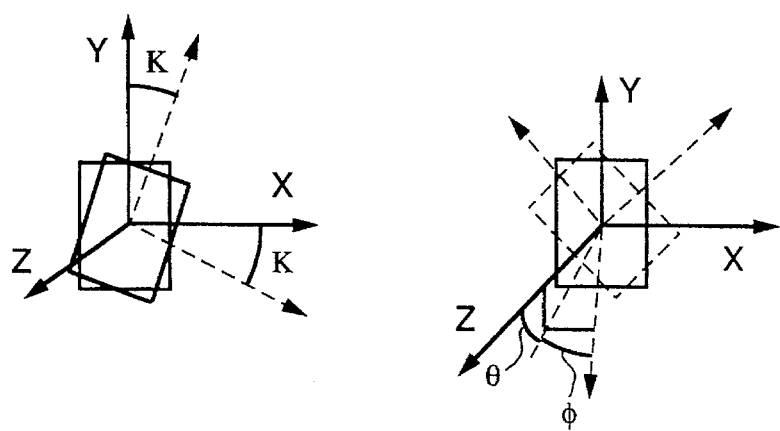
FIGS. 8, 9 illustrate the rotation of the imaging plane, about the Z, and (X,Y) axes, respectively.

Rotations:

3) Curved-arrow icon 85 is selected to spin the imaging plane an angle κ about the (x, y, z) of the image, i.e. about the Z axis shown in FIG. 8, providing 1 degree of freedom. This causes interface device to enter a κ rotation mode. This is done by selecting curved arrow icon 85 and dragging it so that icon 85 rotates about central plus icon 79. The imaging plane for the next acquired image is rotated by the same angle κ about the z axis as the icon. When mouse button 103 is released, curved arrow icon 85 snaps back to the default orientation.

4a) Ball icon 87 is used to tumble or tilt the imaging plane about its center point (x, y, z) giving 2 degrees of freedom ($\theta,\phi$) as shown in FIG. 9, being the ($\theta,\phi$) rotation mode. Operator 5 does this by selecting ball icon 87 and dragging it in the direction of tilt. A line is drawn outward from ball icon 87 in the direction of tilting, and disappears when mouse button 103 is released. The imaging plane of the next acquired image is tilted about an axis perpendicular to the direction of the drawn line, and the degree of tilt is proportional to the length of the drawn line.

4b) In an alternative embodiment, ball icon 87 is used to tumble or tilt the imaging plane about its center point, again 2 is degrees of freedom ($\theta,\phi$). Operator 5 performs this by selecting ball icon 87 and dragging icon 87 in the direction of tilt. A line is no longer drawn outward from ball icon 87. Instead, a central circle is displayed to provide visual feedback. When ball icon 87 is selected the central circle appears, surrounding central plus icon 79. As cursor 75 is dragged away from ball icon 87, the central circle is deformed into an ellipse whose short axis is in the direction in which the icon is dragged. This is meant to give the appearance of a circle being tilted on its edge. The degree of deformation of the ellipse is proportional to the extent of the drag, and to the desired angle of tilting of the imaging plane. For an imaging plane that is tilted 90 degrees relative to the displayed image, the ellipse is distorted into straight line, denoting a circle (and a new imaging plane) that is being viewed completely edgeon. When mouse button 103 is released, the distorted circle disappears.

In FIG. 7, a global coordinate system, or imaging coordinate system is shown which is fixed with respect to the MR imager. Z axis runs through the axis of the MR imaging magnets 2, 4. Imaging plane 120 is selected by defining a center point of the plane and three orientation angles ($\theta,\phi,\kappa$)

defining a rotation about the ($I_x, I_y, I_z$) axes, respectively. A local coordinate system (X,Y,Z) is fixed with respect to the current imaging plane and centered at current imaging plane 120 center point 121.

Operator 5 first determines a location of an initial center point 121 of imaging plane 120 and an initial orientation of initial imaging plane 120. The centerpoint location and plane orientation are provided to global transformation device 110 which calculates a standard 3×3 solid body rotation matrix R, which transforms points on planes 120 defined in the local coordinate system fixed with respect to the current imaging plane 120, to global coordinates fixed with respect to the imaging system. Global transformation device 110 stores and retains the displacement vector r and the 3 × 3 transformation matrix R.

Operator 5 then interacts with interface device 90 to determine a new translated imaging plane as shown in FIGS. 5 and 6, or a new rotated imaging plane as shown in FIGS. 8 and 9.

Figure 4:
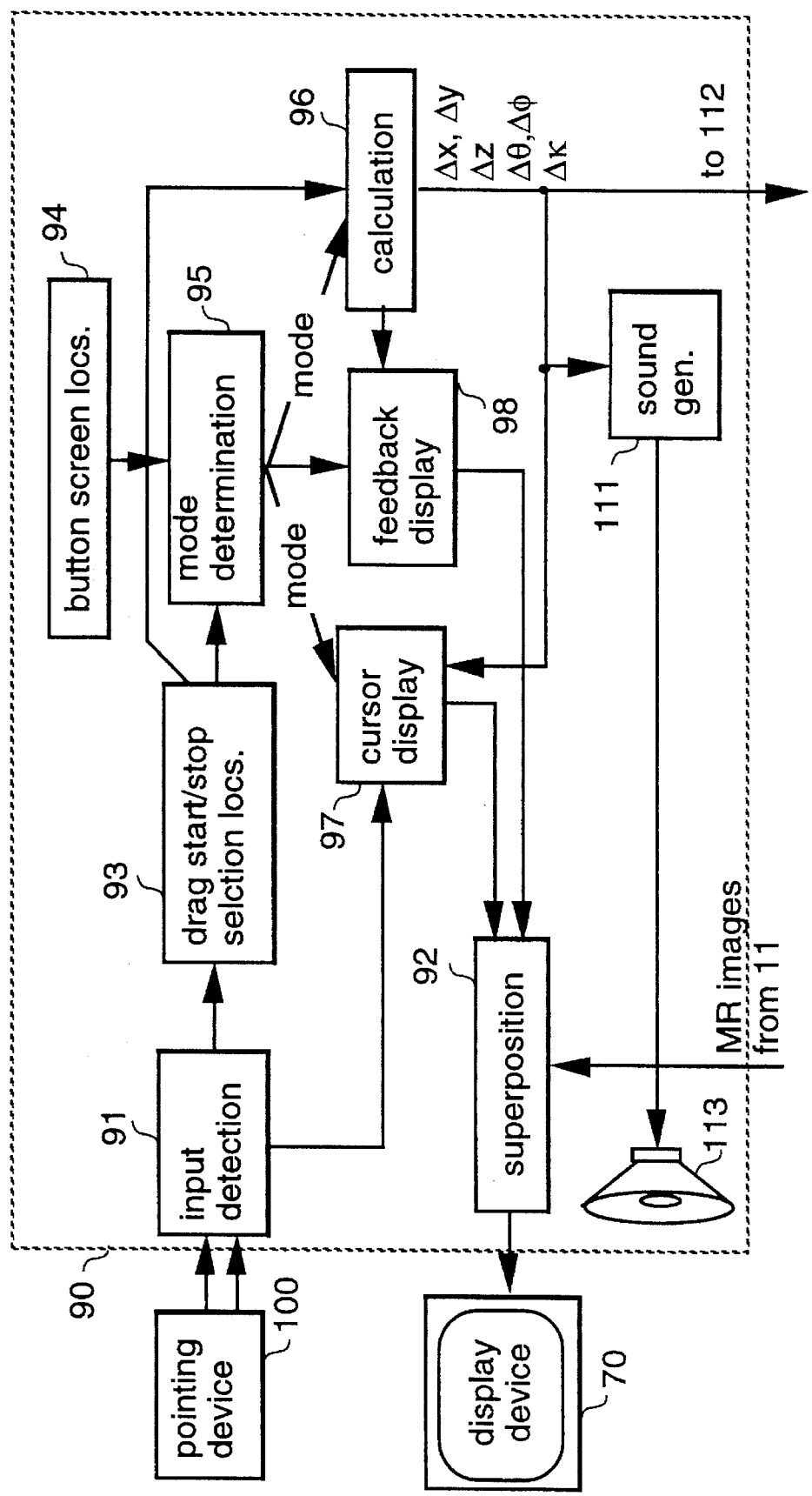
FIG. 4 is a more detailed block diagram of interface device of FIG. 1.

FIG. 4 shows a more detailed block diagram of interface device 90 of FIG. 1. Pointing device 100 provides input to an input detection device 91. This determines the current location of mouse 101, or the current location being touched on a touch sensitive screen. Input detection device also determines if a mouse button has been pressed and also correlates screen locations where the mouse button was first pressed and the screen location where it was released indicating a "drag" start and stop screen location. The drag start and stop screen locations and the selection locations are stored independently in a storage device 93. The current location of the mouse is provided to cursor display 97. A mode determination device 95 receives the drag start and stop locations from storage device 93 and also receives button screen locations from another storage device 94 to determine if a screen button has been selected. If it has, the mode corresponding to that screen button is entered. Each mode pertains to one of the icons previously described. The selected mode is then provided to cursor display 97, a feedback display 98 and a calculation device 96. Feedback display synthesizes screen images indicating the proposed image translation, or orientation.

Calculation device 96 receives the drag start and stop screen locations and the selection locations and based upon which mode it is operating in, determines new imaging plane parameters.

In the x, y translation mode, cursor display 97 displays a cursor which is hand icon 81, feedback display device 98 may display a proposed imaging plane outline which is moved around in the plane of the current image. Calculation device 96 determines an offset to imaging plane center point after the mouse button is released or the operator is no longer touching the touch sensitive screen.

Similarly, selecting the circle-x icon 83 operator 5 causes interface device 90 to operate in the z depth mode. In this mode, cursor display 97 displays the circle -x cursor in a size proportional to how far it is dragged upward or downward as described above. Feedback display device 98 need not display any feedback information other than that provided by cursor display 97. Calculation device 96 updates imaging plane center point by adding to the z coordinate in an amount proportional to the degree in which the icon was dragged in a vertical v screen direction. Calculation device provides this information to imaging plane change storage device 112.

By selecting curved arrow icon 85, operator 5 causes interface device 90 to enter the κ rotation mode. In the κ rotation mode, cursor display 97 shows the curved-arrow icon at a location identified by the mouse or screen coordinate on the touch sensitive screen, feedback display 98 may provide an outline of an imaging plane rotated about the z axis as shown in FIG. 8, and calculation device 96 determines a κ offset which is stored in storage device 112.

By selecting ball icon 87, operator 5 causes interface device 90 to enter the (θ,φ) rotation mode. In this mode, cursor display 97 displays the cursor in the appropriate location which is a ball icon, feedback display 98 may display an outline of the proposed imaging plane which is rotated relative to plus icon by angles (θ,φ) as shown in FIG. 9.

The output of cursor display 97 and feedback display 98 are provided to a superposition device 92. Superposition device 92 also receives the reconstructed MR image from reconstruction unit 11. Superposition device 92 displays the MR image on display device 70 and superimposes the output of cursor device 97 and feedback display device 98 for all modes on the displayed image.

The offsets and translation and rotation for imaging plane acquired by interface unit 90 are stored in storage device 112.

In an alternative embodiment, interface device 90 also includes a sound generator 111 coupled to calculation device 96 which receives the offsets and produced a unique sound signal in real-time for each translation or rotation offset as they are actively being changed. A speaker device converts the sound signal into an audible sound heard by the operator. Examples of sounds would be a sound of a rolling bowling ball corresponding to a change in (θ,φ), a ratcheting sound corresponding to a change in κ, a sliding sound when there is an active change in x,y position of the proposed imaging plane, and a tone decreasing in frequency, simulating falling, as proposed imaging plane depth z is increased, and an increase in frequency of the tone as the depth of the proposed imaging plane is decreased.

The orientation of imaging plane 120 shown in FIG. 7 is defined with respect to the imaging coordinate system through a rotation matrix $R_{old}$. The change in plane orientation with respect to the coordinate system of imaging plane 120 may be given by a second rotation matrix R'. Then the new orientation $R_{new}$ of imaging plane 121 with respect to the imaging coordinate system is found through a matrix multiplication $R_{new} = R_{old}*R'$.

Likewise, if $r_{old}$ is the displacement vector from the center of the imaging coordinate system to the center of imaging plane 120 in the imaging coordinate system and r' being (Δx,Δy,Δz) is the change in center point location 121 of imaging plane 120 in the coordinate system of plane 120, then the new displacement vector $r_{new}$ in the imaging coordinate system is $$r_{new} = r_{old} + R_{old}*r'.$$

This describes precisely the functions of global transformation device 110 of FIG. 1. It reads the translation and rotation offsets stored in storage device 112 and updates displacement vector r and rotation matrix R. This updated displacement vector and rotation matrix are provided to pulse sequencer 20 which drives the MR imaging system to obtain images at that selected location.

Figures 10, 11:
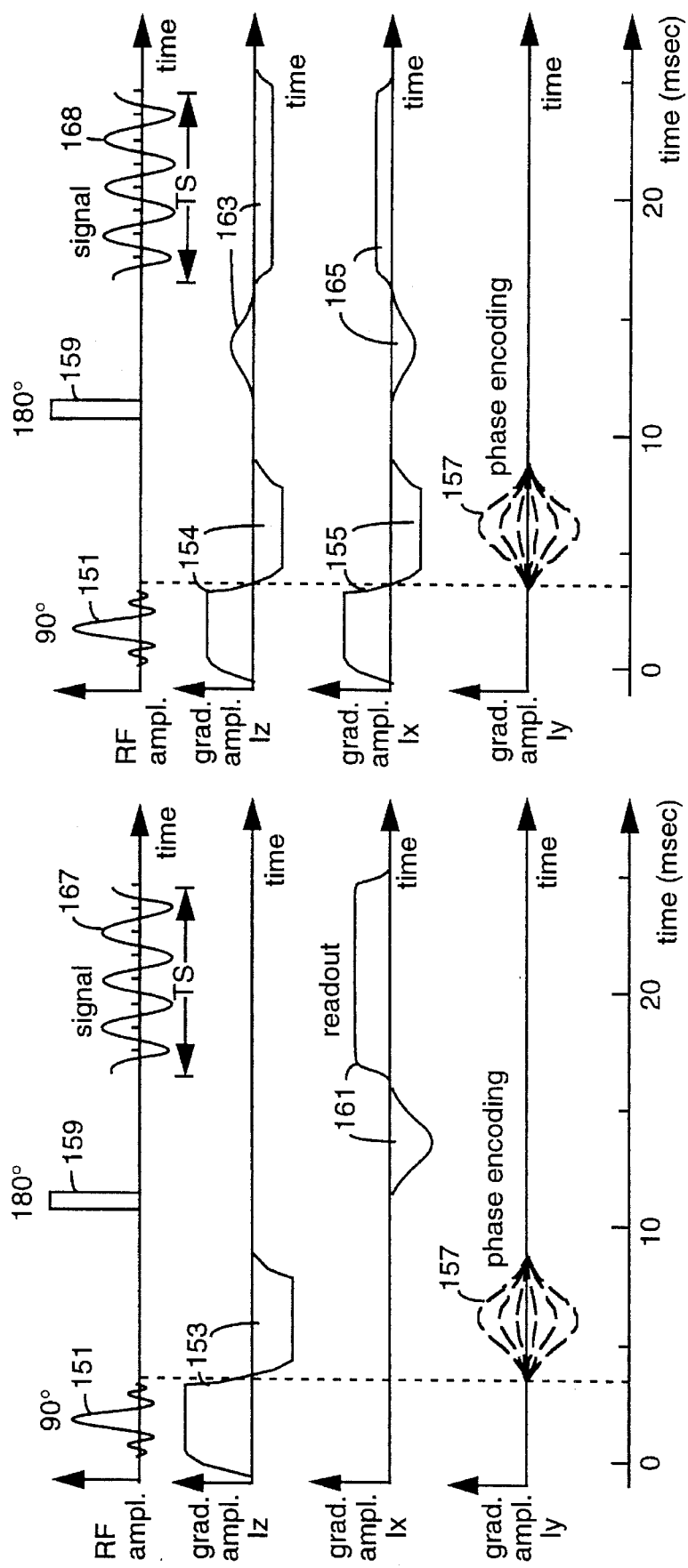
FIG. 10 graphically illustrates an MR pulse sequence to excite an imaging plane oriented in an $I_x$, $I_y$ plane.
FIG. 11 graphically illustrates an MR pulse sequence to excite an imaging plane obliquely oriented with respect to the $I_x$, $I_y$ plane.

FIG. 10 shows a conventional pulse sequence which excites an imaging plane oriented in the global coordinates $I_x$-$I_z$ plane with respect to an imaging device. An 90° RF excitation pulse 151 is applied simultaneously with a first lobe of a slice selection pulse 153 in the $I_z$ direction. A second lobe of slice selection pulse 153 is applied simultaneously with a phase encoding pulse 157 in the $I_y$ direction. A 180° refocussing RF pulse 159 is then applied, followed by a first lobe of a readout pulse 161 in the $I_x$ direction. A second lobe of readout gradient 161 is applied and an MR signal 167 is acquired during time $T_s$ from the $I_x$-$I_z$ plane.

This pulse sequence may be modified to excite an imaging plane in an oblique direction. In the example of FIG. 11, an imaging plane oriented 45° with respect to the $I_x$ and $I_y$ axes is created by mixing gradient pulses along the $I_x$ and $I_z$ directions of FIG. 10 to result in gradient pulses 154 and 155 of FIG. 11. Also, readout gradient pulse 161 is used to construct readout pulses 163, 165. In FIG. 10, a slice select gradient pulse in the $I_x$ direction, and readout pulse in the $I_z$ direction are zero. With the other pulses being applied as described in FIG. 10, the pulse sequence of FIG. 11 causes a MR response signal 168 to be emitted by an imaging plane oriented at a 45° angle with respect to the $I_x$ and $I_z$ axes and be imaged. For a more detailed discussion of imaging plane orientation, please refer to U.S. Pat. No. 5,038,783, Aug. 13, 1991, C. L. Dumoulin, "Multiple gradient echo pulse sequence for acquisition of NMR Angiograms."

While several presently preferred embodiments of the present novel invention have been described in detail herein, many modifications and variations will now become apparent to those skilled in the art. It is our intent therefore, to be limited only by the scope of the appending claims and not by the specific details presented by way of illustration.

What we claim is:

1. A method of producing magnetic resonance (MR) images of a subject in an MR imaging device in an interactive fashion, comprising the steps of:

a) acquiring a current MR image of said subject at an imaging plane centered at (x,y,z) and oriented at angles (θ,φ,κ) with respect to $I_x$,$I_y$,$I_z$ axes of a global coordinate system fixed with respect to the MR Imaging device;

b) displaying the current image on a monitor screen;

c) enabling imaging plane prescription by selecting an enable button displayed on the monitor;

d) displaying a x,y translate icon, a z translate icon, a spin icon and a tilt icon e) translating a center of a proposed imaging plane by a translation offset Δz proportional to γ, when the z translate icon is selected and dragging it a distance γ, f) translating the center of the proposed imaging plane by a translation offset Δx,Δy proportional to α,β, when the x,y translate icon is selected and dragging it a distance α,β in the x, y directions, respectively;

g) rotating about the Z axis through the center of the imaging plane by a rotation offset Δκ proportional to γ, when the spin icon is selected and dragging an angle γ, h) rotating the proposed imaging plane by rotation offsets Δθ,Δφ about the X and Y axes, respectively, when the tilt icon is selected and dragged through angular distances i) transforming the offsets to transformed coordinates relative to the global coordinate system;

j) passing the transformed coordinates to said MR imaging device;

k) acquiring a new MR image with the transformed coordinates; and l) displaying the newly acquired MR image as the current image.

2. The method of producing MR images of claim 1 wherein steps "d" – "l" are repeated a plurality of repetitions to allow interactive imaging of structures within said subject from a desired perspective.

3. The method of producing MR images of claim 1 further comprising, before the step of acquiring a new MR image, the step of displaying visual feedback on the monitor indicating the proposed imaging plane offsets relative to the current imaging plane.

4. The method of producing MR images of claim 3 wherein the step of displaying visual feedback comprises the steps:

a) displaying the x,y translation icon at a monitor screen location indicating the center of the proposed imaging plane at the monitor screen locations determined by the translation offsets ($\Delta x,\Delta y$) when the x,y translation icon is selected and dragged;

b) displaying the z translation icon at a monitor screen location and a size simulating depth perspective, indicative of the proposed imaging plane depth $\Delta z$, when the z translation icon is selected and dragged; and c) displaying the z rotation icon and an outline of the proposed imaging-plane at a monitor screen location to indicate a rotation offset $\Delta \kappa$ of the proposed imaging plane relative to is the current imaging plane when the z rotation icon is selected and dragged; and d) displaying the outline of the proposed imaging plane oriented at rotation offsets ($\theta,\phi$) to indicate the orientation of the proposed imaging plane relative to the current imaging plane when the tilt icon is selected and dragged.

5. An interactive magnetic resonance (MR) imaging system comprising:

a) an MR imaging device for acquiring MR images of a subject at an imaging plane defined in global coordinate system fixed with respect to the imaging device;

b) transformation means coupled to the MR imaging device, for converting proposed imaging plane offsets defined with respect to a current imaging plane to global coordinates;

c) a monitor for displaying images and screen buttons at predefined screen locations provided to it;

d) a pointing device functionally coupled to the transformation means, for interacting with an operator for selecting screen locations and dragging icons over a plurality of screen locations;

e) an interface means coupled to the pointing device, the monitor, the transformation means, for receiving the selected screen locations, for calculating icons pertaining to the selected screen locations, for determining the screen locations over which the selected icon was dragged, for adjusting proposed imaging plane translation offsets ($\Delta x,\Delta y$),$\Delta z$, proposed imaging plane rotation offsets ($\Delta\theta,\Delta\phi$), $\Delta\kappa$, and for providing the proposed imaging plane offsets to the transformation means causing the MR imaging device to acquire a new image with the proposed imaging plane offsets.

6. The interactive magnetic resonance (MR) imaging system of claim 5 wherein the interface means further comprises:

a) a sound generator for receiving the rotation and translation offsets, and for producing a unique sound signal for each offset actively being changed; and b) a speaker device coupled to the sound generator for convening the sound signal to an audible sound.

* * * * *